United States Patent [19]

Armstrong et al.

[11] Patent Number: 4,692,998

[45] Date of Patent: Sep. 15, 1987

[54] PROCESS FOR FABRICATING SEMICONDUCTOR COMPONENTS

[75] Inventors: Albert L. Armstrong, Latham, N.Y.; Joel L. Goodrich, Westford, Mass.

[73] Assignee: M/A-COM, Inc., Burlington, Mass.

[21] Appl. No.: 693,477

[22] Filed: Jan. 12, 1985

[51] Int. Cl.$^4$ .................. H01L 21/265; B01J 17/00
[52] U.S. Cl. .................. 437/225; 148/DIG. 43; 148/DIG. 50; 156/659.1; 156/660; 156/661.1; 357/55; 357/58; 437/203
[58] Field of Search .............. 29/576 W, 577 C, 578, 29/580; 148/DIG. 43, DIG. 50; 357/55, 58; 156/659.1, 660, 661.1

[56] References Cited

U.S. PATENT DOCUMENTS

| | | | |
|---|---|---|---|
| 4,004,341 | 1/1977 | Tung | 29/578 |
| 4,083,098 | 4/1978 | Nicholas | 29/578 |
| 4,243,997 | 1/1981 | Natori et al. | 357/58 |

OTHER PUBLICATIONS

In Re Garrett Corp. vs. United States, 164 USPQ 521.
Ex Parte Goell and Smith, 212 USPQ 384.

Primary Examiner—Upendra Roy
Attorney, Agent, or Firm—Wolf, Greenfield & Sacks

[57] ABSTRACT

A process for the fabrication of semiconductor components and in particular a process in which the components are fabricated with a controlled spacing of etched channels. The process is in particular utilized in fabricating a monolithic array of elements such as a pin diode array. The process of the present invention combines the use of an anisotropic silicon etching process for the desired device geometries with a means of defining all device surface topology by substantially a single photomask thus eliminating critical mask alignment. A second embodiment of the invention is also described employing fewer layers of deposition with a double photomask step.

7 Claims, 34 Drawing Figures

PROCESS FOR FABRICATING SEMICONDUCTOR COMPONENTS

BACKGROUND OF THE INVENTION

The present invention relates in general to a process for the fabrication of semiconductor components. More particularly, the invention relates to a process in which the semiconductor components are fabricated with a controlled spacing of etched channels. The process of the present invention is in particular utilized in fabricating a monolithic array of elements such as a PIN diode array.

In connection with the description of the process of this invention and the related prior art processes, reference is made to microwave control devices such as the PIN diode. However, it is understood that the concepts of the present invention also apply to other forms of semiconductor control devices.

The aforementioned diode is known to be comprised of P-doped and N-doped regions separated by an intrinsic (undoped) region. For low RF loss and optimum on/off switching performance, the following properties are desired for such a device;
1. Well-defined and heavily doped P and N regions.
2. P and N regions oriented as parallel surfaces to the I-region.
3. I-regions that are well passivated with oxide where exposed to external surfaces.
4. I-region dimensions well controlled and consistent.

The control and uniformity of the I-region geometry is particularly important when the PIN diodes are connected in series or parallel because variations in uniformity effect the proper RF signal distribution and DC control bias distribution.

PRIOR ART

Two prior art fabrication processes are now described. The first process uses conventional planar techniques. However, products fabricated by this process generally produce diodes of poor quality. The second process involves etching into the surface of the semiconductor. This second process does produce diodes of improved quality, but the processing steps become quite critical.

Figure 1A:
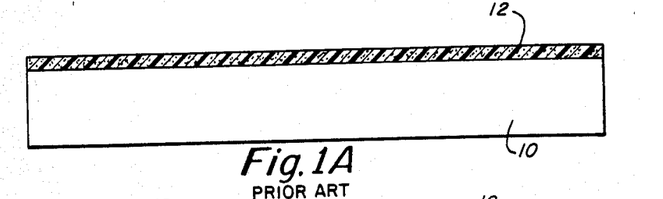
FIGS. 1A–1E illustrate a sequence of steps carried out in a prior art planar process.
Figure 1B:
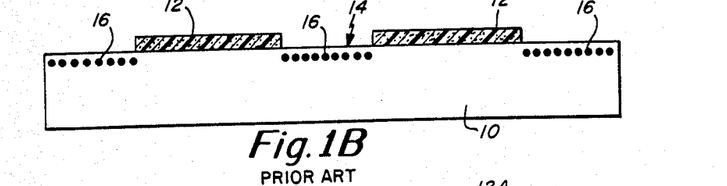
Figure 1C:
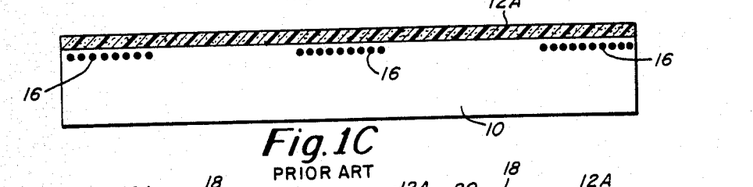
Figure 1D:
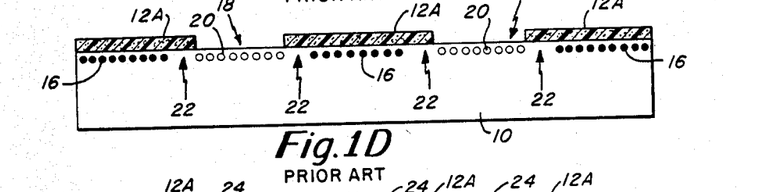
Figure 1E:
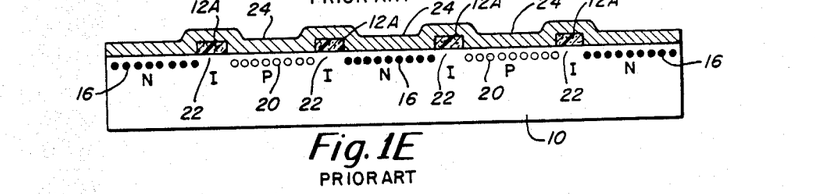
Figure 2:
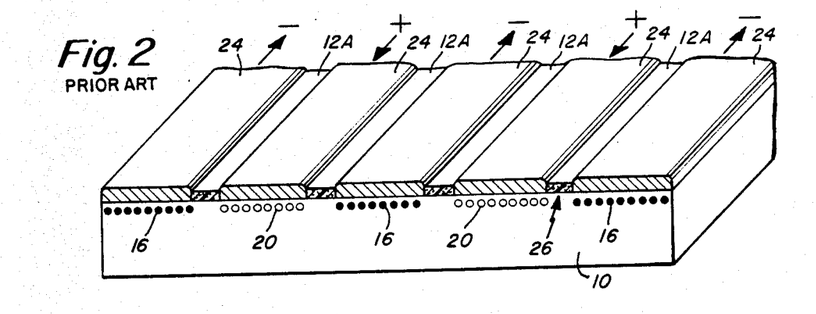
FIG. 2 is a fragmentary perspective view illustrating the final planar process component.

Reference is now made to FIGS. 1A-1E and FIG. 2. FIGS. 1A-1E illustrate successive steps that are carried out in the conventional planar process for fabricating diodes. FIG. 2 illustrates the final planar process component.

One starts with a silicon substrate 10. The surface of the silicon substrate is polished and cleaned. Next, a silicon oxide is thermally grown on the top surface of the silicon wafer or substrate. FIG. 1A shows the silicon oxide layer 12. Employing a mask, a first photoresist is applied. This exposes predetermined regions as illustrated in FIG. 1B. The exposed oxide is etched at regions 14 in FIG. 1B and these regions are then doped with a first dopant as indicated at 16 in FIG. 1B.

Thereafter, the remaining oxide layer 12 is removed and a new oxide layer 12A is grown over the entire surface as illustrated in FIG. 1C. FIG. 1C also shows the remaining doped region 16 of N-type dopant.

The next step is to apply a photoresist with a second mask and expose regions for a second dopant which would be a P-type dopant. FIG. 1D shows the oxide layer 12A etched in regions 18. In this connection, note that the regions 18 are offset from the previous regions 14 so that undoped sections of the silicon substrate are exposed. The silicon substrate is then subject to a second dopant which is a P-type dopant indicated at 20 in FIG. 1D.

It is noted that there is provided also, an I-region 22 illustrated in FIG. 1D between each of the opposite dopant regions. The size or width of this I-region, it is noted, is dependent on the accuracy of the location of the masks for the two previous photoetching steps.

After completing the structure illustrated in FIG. 1D, a third mask is used and a photoresist is applied exposing all regions except the oxide over the I-regions 22. After the photoresist is applied, then the exposed oxide is etched so as to leave oxide layers only over the I-regions 22 as illustrated in FIG. 1E. The next step is to metallize the top surface as illustrated in FIG. 1E. This can be carried out by evaporation or by sputtering to form the top metallized layer 24 illustrated in FIG. 1E.

The next step is to apply still a further photoresist and expose the metal above the I-regions. The exposed metal is then etched. The remaining metal may then be plated as desired for electrical conductivity.

After all of these steps are completed, then one has the planar process component illustrated in FIG. 2. FIG. 2 clearly shows the PIN diode at 26. The metal layer 24 forms metal conductors for bias current. FIG. 2 also shows the polarity of bias voltages that may be applied to the metal conductors.

There are two major problems associated with the process that has just been described. First, the P and N regions have an undesirable (for electrical conduction) geometry by being in-line in the same plane. The preferred geometry for the P and N regions would be one in which these regions are in opposing parallel surfaces. The second problem is that the step of exposing the second photomask as in FIG. 1D, is quite critical in its alignment. If the mask is slightly off alignment, the I-regions are not all the same size. In the particular example shown, if there is any misalignment, then the I-regions would alternate between narrow and wide. This is not desirable.

The second prior art fabrication process that is to be described involves the etching of channels into the silicon wherein these channels are etched perpendicular to the wafer surface. The doping of opposed vertical surfaces with N and P type dopant, respectively, gives the geometry desired for good electrical performance. Also, etching both regions at the same time eliminates the variable I-region size problem referred to in connection with the first process described hereinabove. However, as will be noted in the description that follows, the second photoetching step is on an irregular surface and thus very fault prone.

Figure 3:
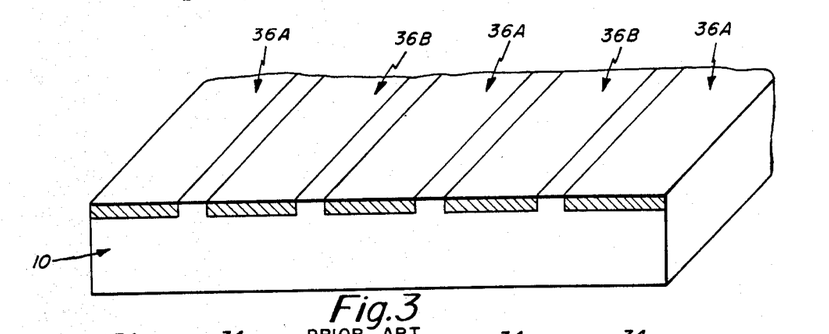
FIG. 3 is a fragmentary perspective view illustrating the final component constructed in accordance with a second prior art fabrication process.

With regard to this second prior art fabrication process, reference can be made to FIG. 3 which shows the final semiconductor component. Also, reference is made to FIGS. 4A-4G which illustrate the successive steps carried out in fabricating the component of FIG. 3. In connection with FIG. 3, it is noted that the N and P regions of pin diodes are the vertical surfaces on the small silicon ridges.

Figure 4A:
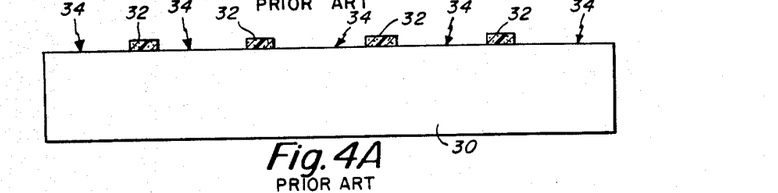
FIGS. 4A–4G illustrate the steps that are carried out to obtain the product of FIG. 3.

Reference is now made to FIGS. 4A-4G which illustrate the steps carried out in this second prior art process. One starts with a silicon substrate 30 and a silicon oxide is thermally grown on the top surface thereof. A first photoetching step takes place to etch the oxide, removing the oxide where it is desired to etch channels into the silicon. FIG. 4A shows the remaining oxide at 32 and the channel defining areas at 34. It is noted that the mask that is employed has to be aligned properly relative to the semiconductor substrate so as to have the channels aligned with 111 planes of the silicon crystal.

Figure 4B:
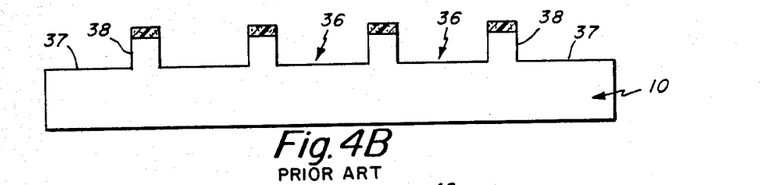

The next step in the process is to etch the silicon using an etchant such as KOH which etches the 110 crystalline surface hundreds of times faster than the 111 crystalline surface. In this regard, refer to FIG. 4B which shows the etched silicon channels 36. FIG. 4B also shows the 110 surface 37 and the 111 surface 38.

Figure 4C:
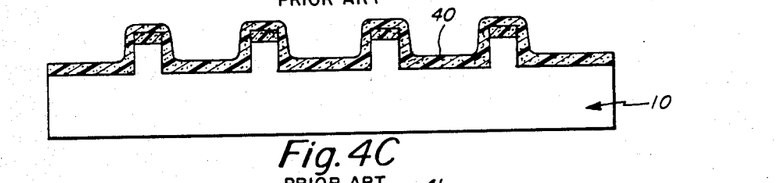
Figure 4D:
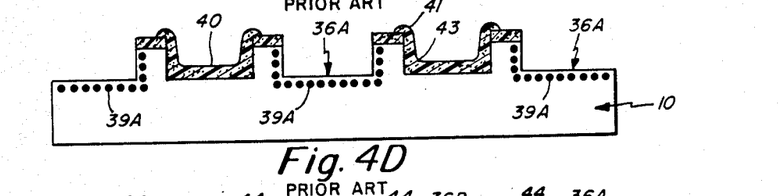

As now illustrated in FIG. 4C, a new oxide layer 40 is grown on the surface and functions as a dopant mask. A photoresist layer is applied on the surface and exposes the surface to open alternate channels as illustrated in FIG. 4D. The exposed channels 36A shown in FIG. 4D. may then be doped with an N-type dopant as illustrated at 39A.

It is to be noted that when the photoresist is applied to the oxide layer 40, the surface is quite irregular. This is due to the fact that the channels may be as deep as 25 microns. This causes the photoresist to be thin on the top exposed corners as at 41 and thick at the enclosed bottom corners as at 43. The underlying oxide mask is thus prone to failure produced during the photoetching step.

Figure 4E:
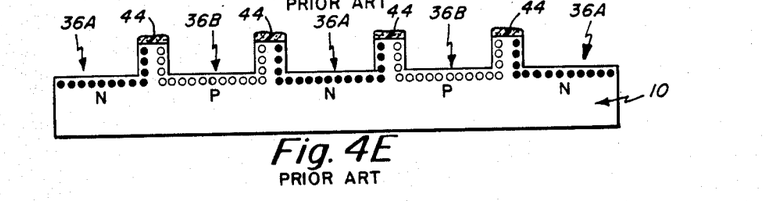

After the N-type doping is carried out, another oxide layer is deposited onto the silicon surface. Then, a second critical photoetch step is used to open the other set of alternate channels which are doped P-type. FIG. 4E illustrates the channels 36A doped N-type and the channels 36B doped P-type. Subsequently, the oxide is removed from both channels and is also removed from the I-regions as the thin oxide at 44 is of questionable value for passivation due to the prior processing steps. Again, reference is made to FIG. 4E which shows the oxide having been removed from the channels exposing the doped alternate P and N channels.

Figure 4F:
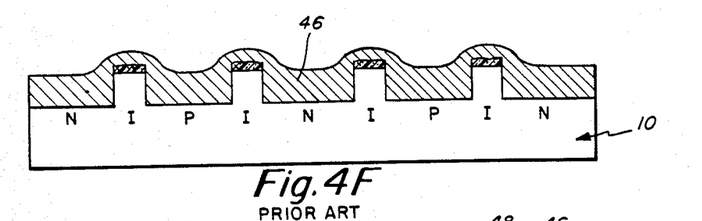
Figure 4G:
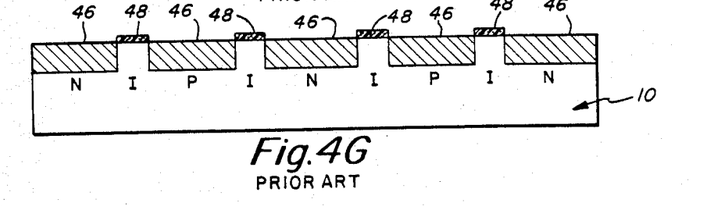

Titanium and gold may then be sputtered onto the surface and a heavy layer of gold is plated on the surface as shown in FIG. 4F by the heavy metal layer 46. The next step is to lap the gold layer 46 to the top of the I-regions and then apply a low temperature passivation to the tops of the I-regions to complete the top surface processing. This is illustrated in FIG. 4G by the low temperature passivation at 48 appearing at the top of the I-regions. Subsequently, etching from the back silicon substrate surface dices or separates the components on the wafer and also creates any beam leads used to contact the component.

As indicated previously, the primary problem with this etched channel process is the difficulty of applying a photoresist to the irregular surface. This creates fault problems that provide poor yield for the product.

OBJECTS OF THE INVENTION

Accordingly, it is an object of the present invention to provide a new and improved fabrication process for the batch fabrication of semiconductor devices, particularly those requiring well-controlled geometries and particularly geometries involving channels etched into the surface of the semiconductor substrate or wafer.

It is another object of the present invention, in connection with the fabrication of an array of PIN diodes, to provide for fabrication of the array on walls perpendicular to the wafer surface and to also provide a good passivation on the tops of the I-regions to minimize surface recombination of the electrical current carriers.

Another object of the present invention is to provide a component fabrication process for semiconductors in which the P and N channels are formed separately.

A further object of the present invention is to provide an improved fabrication process for semiconductor components which has the further capability of incorporating an integral beam lead on the periphery of the array window to facilitate mounting.

Still another object of the present invention is to provide an improved semiconductor component fabrication process in which the I-region width is defined by a single photolithographic step.

A further object of the present invention is to provide an improved semiconductor component fabrication process which has a clean geometry (i.e. no metal spillover) at the I-region surfaces so as to reduce electrical arc over.

Still another object of the present invention is to provide a fabrication process for semiconductor devices in which there is a combination of anisotropic silicon etching for the desired device geometries along with a means of defining all device surface topology by a single photomask, thus eliminating critical mask alignment problems.

Still a further object of the present invention is to provide an improved semiconductor component fabrication process having an extremely high component yield and with the components not suffering from reverse bias leakage and high forward bias voltage drops.

Another object of the present invention is to provide an improved fabrication process for semiconductor components in which the process can be carried out with high yield, at low cost and under more controlled processing conditions.

SUMMARY OF THE INVENTION

To accomplish the foregoing and other objects, features and advantages of the invention, there is provided in accordance with one embodiment of the present invention, a process for fabricating semiconductor devices from a base semiconductor wafer or substrate. There is first deposited at least one layer of a dielectric material on the substrate. In the disclosed embodiment, there are actually a pair of dielectric layers including a first layer of silicon dioxide and a second layer of silicon nitride. A mask is employed to remove portions of the dielectric material in channel defining areas of the substrate. There is then deposited at least a second layer of a dielectric material over the substrate and said one dielectric material. A second mask is employed to remove portions of the second dielectric material. There is then removed at least one of the channel defining areas of the substrate to define a first substrate channel. This first substrate channel is doped with a first dopant. There is then provided a protective layer over the doped first substrate channel. This protective layer is preferably grown but could be disposed by deposition. There is then etched and thus removed, a second one of the channel defining areas of the substrate to define a second substrate channel. This second substrate channel is doped with a second dopant. Finally, one or more metallic layers are deposited in respective first and second substrate channels.

There is also described herein a second process which has a further advantage in that the number of layers that have to be grown or deposited are further minimized in this second process. In the second process described herein in accordance with the invention, on the silicon substrate there is a first dielectric layer that is deposited. This layer is then etched with a first photoetching step so as to remove segments thereof in I-regions of the substrate. Thereafter, a second dielectric layer is grown on the substrate in the areas where the first layer was etched away. This second layer is preferably of a grown silicon dioxide while the first layer is silicon nitride. The next step is to provide a second photoetch in which one segment of the first dielectric layer is removed between the selective growing of the silicon dioxide layer segments. This is in a channel defining area of the substrate and the next step is to etch the channel into the substrate. This is followed by a N-type doping of this first substrate channel. Thereafter, a protective layer is disposed over the just doped channel and the remaining silicon nitride is etched in adjacent channels. Again, the protective layer may be disposed by deposition, but is preferably grown. The silicon wafer is then also etched in the adjacent channels which are P-typed channels. These channels are then doped with a P-typed dopant. It is noted in accordance with this process also that the etching of the silicon is by means of an anisotropic etchant which attacks the 110 crystalline surface (wafer surface) at a rate several hundred times faster than the 111 crystalline surface (vertical walls). Typical etch depths particularly for PIN construction range from 10 to 30 micrometers.

BRIEF DESCRIPTION OF THE DRAWINGS

Numerous other objects, features and advantages of the invention should now become apparent upon a reading of the following detailed description taken in conjunction with the accompanying drawings, in which.

PROCESS OF THE INVENTION

There is now described herein a new fabrication process for the batch fabrication of semiconductive devices, particularly those which require well controlled geometries and particularly geometries involving channels etched into the surface of the semiconductor wafer. The process is described herein in conjunction with the fabrication of an array of pin diodes, although, the process can be used in the construction of other semiconductor components. The process of the present invention as now to be described, provides for the fabrication of an array of diodes on walls perpendicular to the wafer surface. There is also provided a good passivation on the tops of the I-regions to minimize surface recombination. In accordance with the invention, the improvement is carried out to a great extent by virtue of having separate etching or formation of the P and N channels. Also in this regard an improvement is realized by defining the I-region width by a single photolithographic step. The fabrication process maintains a clean geometry at the I-region surface so as to reduce RF arc over.

Figure 5:
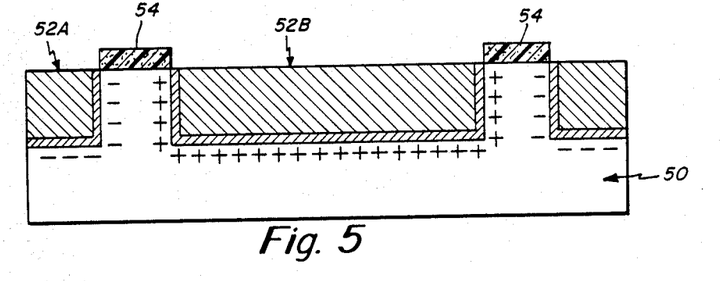
FIG. 5 is a cross-sectional view of a portion of a fully processed semiconductor window element in the form of an array of PIN diodes.

Reference is now made to FIG. 5 which shows a cross-sectional view of the desired end product. In this regard, there is shown a silicon substrate 50 having alternate doped channels 52A and 52B. In FIG. 5 the dopant is illustrated by the opposite polarity notations. FIG. 5 also shows the silicon dioxide passivation at 54.

Figure 6A:
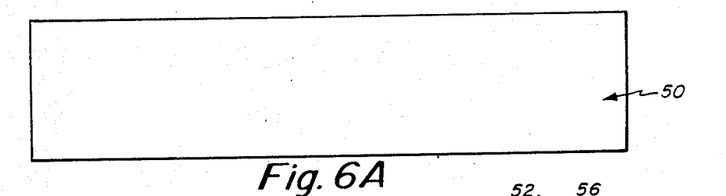
FIGS. 6A–6K illustrate the sequence of steps carried out in forming the final product illustrated in FIG. 5 as in accordance with the improved process of one embodiment of the invention.

Now, with reference to FIGS. 6A–6K, there are shown the successive steps carried out in fabricating the product of FIG. 5. FIG. 6A shows the silicon substrate or wafer 50. The silicon wafer is a polished (110 surface), high resistivity (greater than 500 ohm-cm) silicon wafer.

Figure 6B:
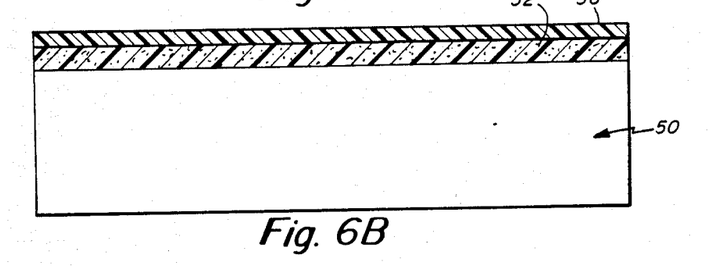
Figure 6C:
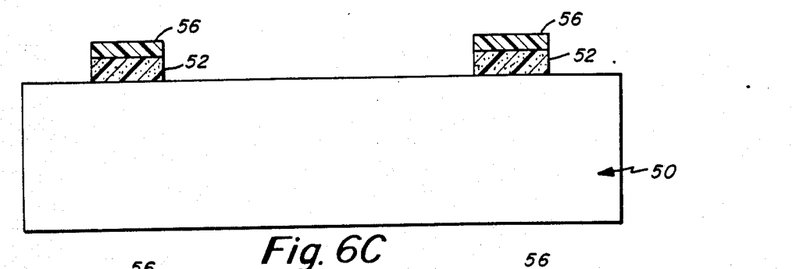

On to the silicon wafer 50 there is thermally grown a layer of silicon dioxide. This layer may be one micrometer thick. This is illustrated in FIG. 6B by the layer 52. This layer remains throughout subsequent processing steps and serves as a passivation for the diode I-regions of the final product as noted by the passivation at 54 in FIG. 5. After the silicon dioxide is thermally grown at layer 52, there is then deposited a second layer 56. This layer may have a thickness on the order of 0.2 micrometers and is of silicon nitride. This layer both protects the first silicon dioxide layer and functions as an etch mask for it.

A photoresist is then applied and both of the layers 52 and 56 are etched. It is noted that this first photomask now defines all channels, both P-type and N-type and hence the I-region thickness is determined by one mask only. With regard to the etching of layers 52 and 56 refer to FIG. 6C.

Figure 6D:
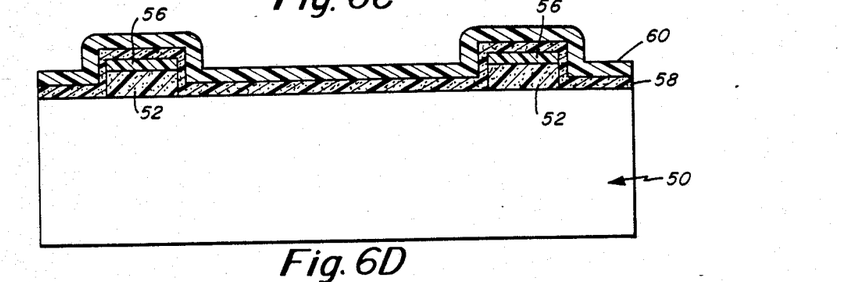

FIG. 6D now illustrates the next steps in the process. This includes the depositing of layer 58 followed by the depositing of layer 60. Layer 58 has a thickness of 0.2 micrometers while layer 60 is thinner having a thickness of 0.1 micrometers. The layer 58 is preferably of silicon dioxide and the layer 60 of silicon nitride. It is noted that the oxide layer is vapor deposited and is preferably not thermally grown. The layer 58 is vapor deposited so as to obtain a uniform thickness of the layer including a uniform thickness over the previously deposited layer 56. It is also noted that the silicon nitride layer 60 is one half the thickness of the oxide layer. It is also to be noted that after the first silicon etching step to be explained soon, no more photolithographic operations are necessary.

Figure 6E:
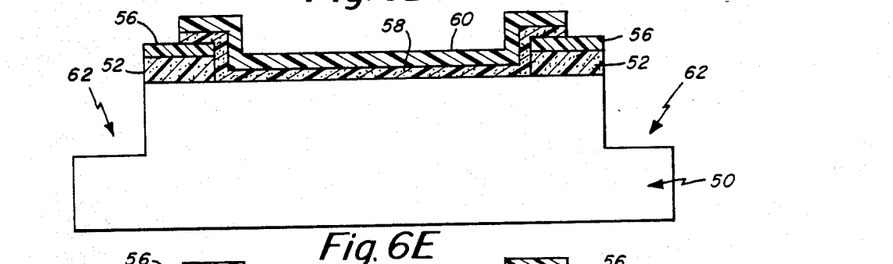

The next step in the process is to apply a photoresist and to then open alternate channels which are to be doped N-type. This is usually carried out by means of a phosphorus doping. Also open at this time are the areas in which beam leads for mounting are to be fabricated. Next is carried out a double etching process including etching away first the exposed silicon nitride layer 60 followed by etching of the exposed silicon dioxide layer 58 in the pattern as illustrated in FIG. 6E. With regard to the etching of the layers 58 and 60, for etching the silicon nitride phosphoric acid may be employed and for etching the silicon dioxide a buffered hydrofluoric acid may be employed. It is furthermore noted in FIG. 6E that the layers 58 and 60 are etched away so as to expose a portion of the underlying layer segments 52 and 56.

The next step as also illustrated in FIG. 6E is the etching of the silicon. The channels in the silicon at 62 are etched using an anisotropic etchant such as KOH. This etchant attacks the 110 crystalline surface (wafer surface) at a rate hundreds of times faster than the 111 crystalline surface (vertical walls). A typical etched depth for PIN diode construction is from 10 to 30 micrometers. As indicated previously, this first etching step is carried out with a photolithographic process but this is the last photolithographic process that is needed in accordance with the concepts of this invention. This thus eliminates mask alignment problems.

As indicated above, one means of etching is with the use of an anisotropic etchant. Alternatively, plasma etching may be employed. This process is also direction and orientation sensitive with respect to the wafer surfaces and thus can be employed in place of the above-referred to etching technique.

Figure 6F:
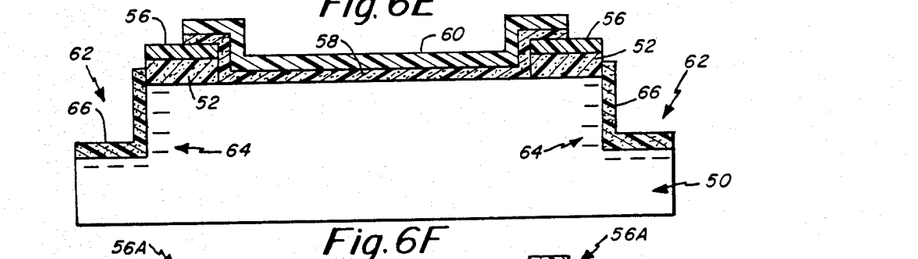

The next steps in the process are illustrated in FIG. 6F. The exposed silicon areas at channel 62 are doped with an N-type dopant such as phosphorus. This is indicated in FIG. 6F at 64. The doping may be by means of a phosphorus dopant. This may be carried out with the use of a phosphorant dopant glass.

The next step involves removal of the phosphorus dopant glass followed by the growing of a silicon dioxide layer 66 in the channel 62. This layer 66 may be 0.5 micrometers thick and is thermally grown. The layer 66 is used as a protective layer for the phosphorus channels during the subsequent boron doping step.

Figure 6G:
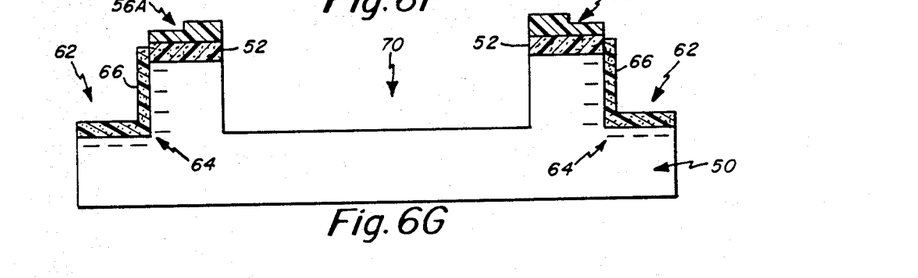

The next steps in the process are illustrated in FIG. 6G. The top relatively thin layer of silicon nitride, namely layer 60 is etched away. It is noted that this etching is accomplished without a photomask which incidentally would be difficult to apply at this stage due to the regular surface. It is noted that in etching the layer 60 that there is also etched a portion of the segment of layer 56 illustrated in FIG. 6G at 56A. However, the layer 56 has been made of sufficient thickness so that there still remains a substantial portion thereof after the etching of layer 60 is completed.

The next step is to etch away the deposited silicon dioxide layer 58. It is noted that this etching is done without the requirement of any photomask. This is possible because the deposited oxide etches many times faster than the thermally grown oxides. In this connection the oxide layer 66 is thermally grown and thus it is not affected to any substantial extent when the layer 58 is etched.

There is also illustrated in FIG. 6G, the exposed silicon forming the remaining channel 70 is etched away using an orientation dependant etchant as before. The depths of both channels 62 and 70 should be about the same but it is noted that absolute accuracy is not necessarily required.

Figure 6H:
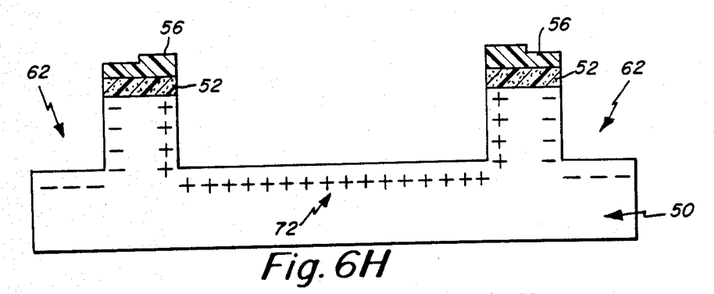

FIG. 6H now illustrates subsequent steps. First, channel 70 is doped with a P-type dopant such as with the use of a boron dopant glass. This doping is illustrated in FIG. 6H at 72. Next, the silicon dioxide layer 66 is etched away leaving the channels 62 and 70 free of any silicon dioxide. The product at this point of the process is illustrated in FIG. 6H.

Figure 6I:
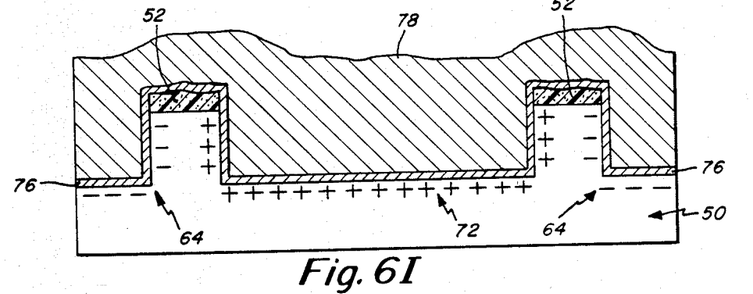

The subsequent steps in the process have to do with the metallization of the product. Thus, in FIG. 6I one of the next steps is to sputter titanium and gold on to the complete surface as a bonding layer. This is illustrated in FIG. 6I as the layer 76. It is noted that the layer 56 is deposited after all of the silicon dioxide has been removed even the segment of the layer 56. However, the layer 76 does cover not only the silicon but also the silicon dioxide layer 52 that remains.

The next step is to plate the wafer with gold until the channels are completely filled. This is also illustrated in FIG. 6I by the gold plating 78.

Figure 6J:
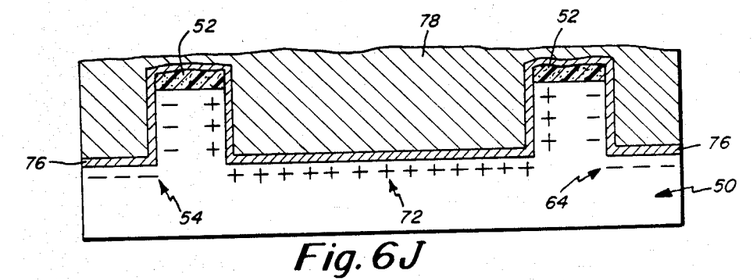

Next, the gold plating 78 is lapped as illustrated in FIG. 6J. This lapping occurs until the tops of the I-regions are nearly exposed. The top surface of the product is then also substantially flat once again.

Figure 6K:
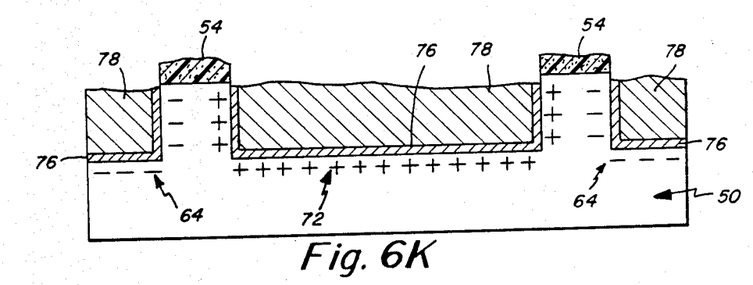

In the sequence of steps it is possible now to carry-out some optional steps. For example, one can preferentially plate up, using a photomask, the beam lead areas or one can photomask the beam lead areas from the subsequent gold etch step. At any rate, one of the next steps in the process is illustrated in FIG. 6K in which the gold is etched to expose the tops of the I-regions. This step leaves a clean gold-silicon interface for arc free operation. FIG. 6K also illustrates the exposed silicon dioxide referred to previously as the passivation 54. In addition to etching the gold the titanium is also etched from the I-regions. At this point the diodes may be tested for proper operation. Subsequently, the wafer is mounted face down on a sapphire disc and the wafer is lapped to the desired final thickness such as, for example, 100 micrometers. A photoresist is applied to the back surface and regions are exposed between components and also regions behind the beam leads. The thickness of the wafer is etched through. This etch is typically done using an isotropic etchant, although both types of etchants can be employed. The last step is to etch the titanium from the back of the beam leads. The process is then substantially complete. The individual components are separated by the last etch step and are ready for mounting into the RF circuit.

FIGS. 7A-7H illustrate another version of the present process of the invention. This has the further advantage of requiring fewer layers and in particular requiring one less silicon nitride layer and one less deposited silicon dioxide layer.

Figure 7A:
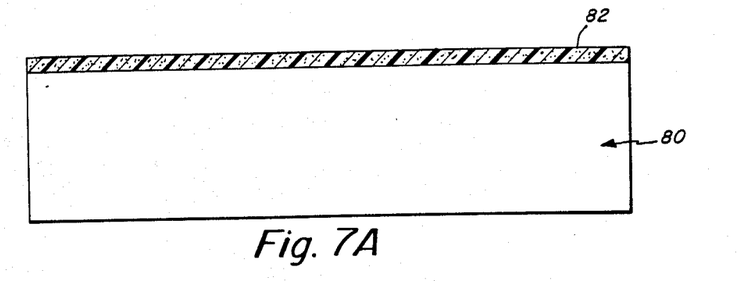
FIGS. 7A–7H illustrate the steps carried out in accordance with a second process in accordance with the present invention.

FIG. 7A shows the silicon wafer 80 this is preferably a polished, high resistivity silicon wafer. On the top surface of the wafer is deposited a layer 82 of silicon nitride.

Figure 7B:
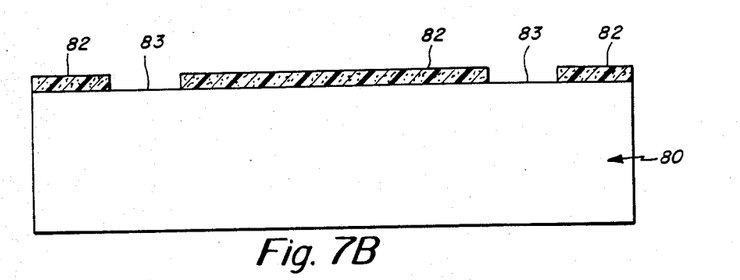
Figure 7C:
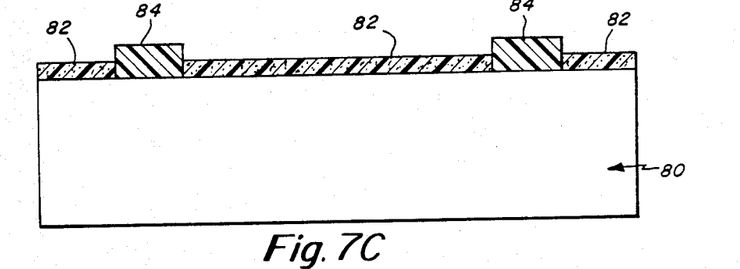

The next step is illustrated in FIG. 7B which shows the use of a first photoetching with the use of an associated mask to, essentially define all of the channels, both P-type and N-type as to their positional arrangement. The silicon nitride layer is shown etched at 83. FIG. 7C now shows the next step in which silicon dioxide is grown in the etched channel in the silicon nitride. Because of the existence of the silicon nitride layer over the major portion of the wafer surface, the silicon dioxide will only grow in the etched channel area 83. FIG. 7C shows the grown silicon dioxide layer 84.

Figure 7D:
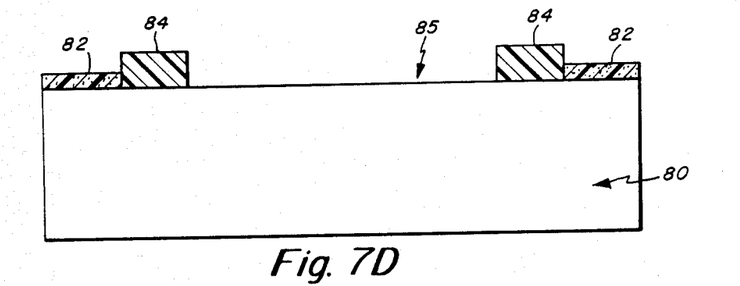

In FIG. 7D there is illustrated the use of a second photoetching step in which alternate segments of the silicon nitride layer 82 are removed. This is illustrated in FIG. 7D at 85. The etchant that is used only removes the silicon nitride layer 82 in that area and has little or no effect upon the grown silicon dioxide layers 84 adjacent thereto.

Figure 7E:
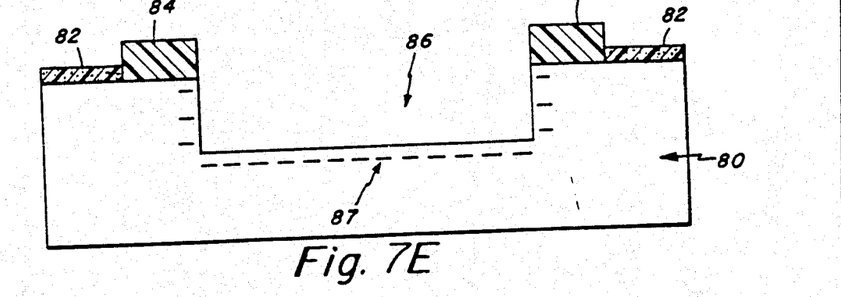

FIG. 7E illustrates the next step in the process and that is of etching the silicon wafer 80 at the area 85 to define an N-type channel 86.

FIG. 7E in addition to illustrating the etching of channel 86 in the silicon also illustrates at 87 the doping of the channel. This is an N-type doping such as with the use of a phosphorus dopant glass.

Figure 7F:
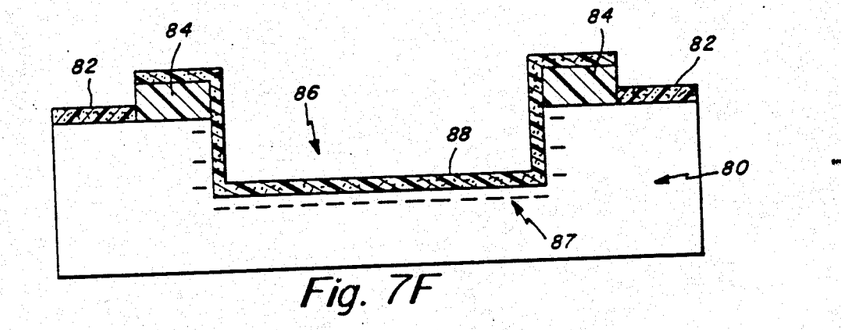

FIG. 7F illustrates the growing of a silicon dioxide layer 88 in the previously etched and doped silicon channel 86. It is noted that the protective layer 88 also extends to cover the previously grown silicon dioxide layer 84.

Figure 7G:
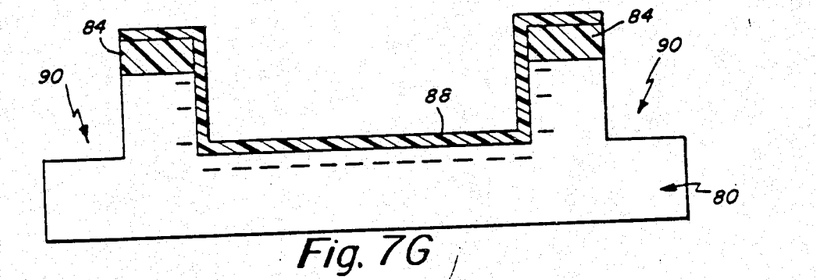

FIG. 7G illustrates the next step in the process which is to etch the silicon nitride layer 82 using an etchant that etches only the layer 82 and has little or no effect upon the silicon dioxide layer 88. After the etching of the silicon nitride layer then the silicon itself is etched as illustrated in FIG. 7G to form P-type channels 90.

Figure 7H:
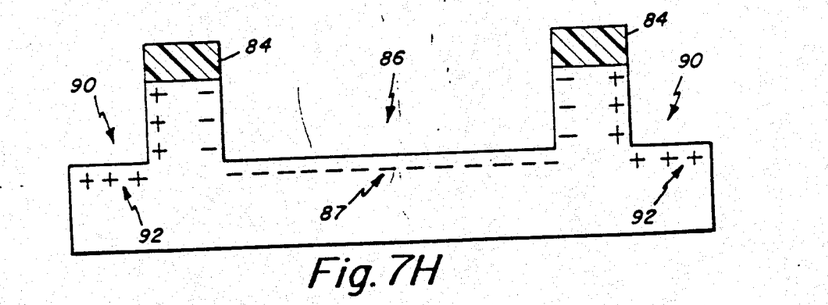

FIG. 7H illustrates the last steps in the process which include removal of the silicon dioxide layer 88 leaving at least a portion of the silicon dioxide layer 84 and also providing a doping of the channels 90 by means of a P-type dopant such as with the use of a boron dopant glass. The P-type dopant is illustrated at 92.

Subsequent steps are also carried out in this second version of the process of the invention including the metallization steps previously carried out and illustrated in FIGS. 6I–6K.

Having now described a limited number of versions of the present invention, it should now be apparent to those skilled in the art that numerous other embodiments and modifications thereof are contemplated as falling within the scope of the present invention as defined by the appended claims.

What is claimed is:

1. A process for fabricating semiconductor devices comprising the steps of;
   providing a semiconductor substrate in which will be defined an I-region separated by first and second channel defining areas,
   disposing a layer of a dielectric material on said substrate including one and another segments thereof,
   removing portions of said dielectric material in I-regions of the substrate,
   disposing a second layer of a dielectric material over said substrate in said I-region,
   removing at least said one segment of the first dielectric material in the first channel defining area of the substrate,
   removing the substrate in said first channel defining area to define a first exposed substrate channel,
   doping the exposed substrate in said first substrate channel with a first dopant,
   disposing a protective layer over said doped first substrate channel,
   removing at least said another segment of the first dielectric layer of the substrate in said second channel defining area of the substrate,
   removing the substrate in said second channel defining area to define a second exposed substrate channel,
   doping the exposed substrate in said second substrate channel with a second dopant,
   and depositing a metallic layer in said first and second substrate channels.

2. A process for fabricating semiconductor devices as set forth in claim 1 wherein the first layer is a layer deposited of silicon nitride.

3. A process for fabricating semiconductor devices as set forth in claim 1 wherein the step of depositing metallic layers includes depositing of a bonding layer followed by metallic plating of a layer.

4. A process for fabricating semiconductor devices as set forth in claim 2 wherein the second layer is a layer grown of silicon dioxide.

5. A process for fabricating semiconductor devices as set forth in claim 3 including the step of lapping the metallic plating.

6. A process for fabricating semiconductor devices as set forth in claims 3 or 5 including etching of the metallic plating to expose the I-regions.

7. A process for fabricating semiconductor devices as set forth in claim 6 wherein the etching of the metallic layer and metallic plating exposes the first dielectric layer which functions as a passivation.

* * * * *